United States Patent [19]
Campbell et al.

[11] Patent Number: 5,951,324
[45] Date of Patent: Sep. 14, 1999

[54] SOCKET ASSEMBLY FOR METER CENTER

[75] Inventors: James Monroe Campbell, Atlanta;
Scot Eugene Remmert, Mt. Pulaski;
Larry Joe Simpkins, Warrensburg;
Edward Hugh Lechleiter, Hartsburg;
Glen Clark Naugle, Lincoln, all of Ill.

[73] Assignee: Eaton Corporation, Cleveland, Ohio

[21] Appl. No.: 08/987,786

[22] Filed: Dec. 9, 1997

[51] Int. Cl.$^6$ ................................................ H01R 33/945
[52] U.S. Cl. ........................ 439/517; 439/508; 361/670; 361/662
[58] Field of Search ................................. 439/517, 508, 439/167, 146, 654; 361/661, 662

[56] References Cited

U.S. PATENT DOCUMENTS

| | | | |
|---|---|---|---|
| 2,492,616 | 3/1949 | Bohnson | 439/654 |
| 3,003,085 | 10/1961 | Rund | 361/662 |
| 3,914,564 | 10/1975 | Reed et al. | 361/662 |
| 4,117,530 | 9/1978 | Reed et al. | 361/662 |
| 4,428,641 | 1/1984 | Flachbarth et al. | 439/654 |
| 4,532,574 | 7/1985 | Reiner et al. | 361/365 |
| 5,129,841 | 7/1992 | Allina et al. | 439/517 |
| 5,620,337 | 4/1997 | Pruehs | 361/662 |
| 5,664,969 | 9/1997 | Peterson et al. | 439/746 |

OTHER PUBLICATIONS

PowerMaster™ Multiple Metering, pp. 1–7 and 17, Eaton Corporation, May, 1996.

*Primary Examiner*—Steven L. Stephan
*Assistant Examiner*—Hae Moon Hyeon
*Attorney, Agent, or Firm*—Martin J. Moran

[57] ABSTRACT

Angle members forming the vertically extending supply buses in a meter center have arcuate offsets so that flanges on the ends of horizontally extending tenant buses form tenant stab contacts which are vertically aligned with supply stab contacts on straight sections of the outwardly projecting flanges of the supply bus angle members. Meter socket assemblies have double ended fastenerless meter jaws one pair of which plug onto the supply bus stab contacts and another pair of which plug onto the tenant bus stab contacts, and into which the meters are plugged. The double ended fastenerless meter jaws are fabricated from a pair of elongated flat members having end sections bent back on and diverging from straight center sections, and terminal sections which extend toward each other from the end sections and converge slightly toward the center sections. Spring clips clamp the terminal sections of the pair of elongated members in compliant confronting relationship to form the double ended fastenerless meter jaws. The center sections of the jaws have confronting laterally offset tabs which snap into and lock the jaws in apertures in a socket plate.

11 Claims, 14 Drawing Sheets

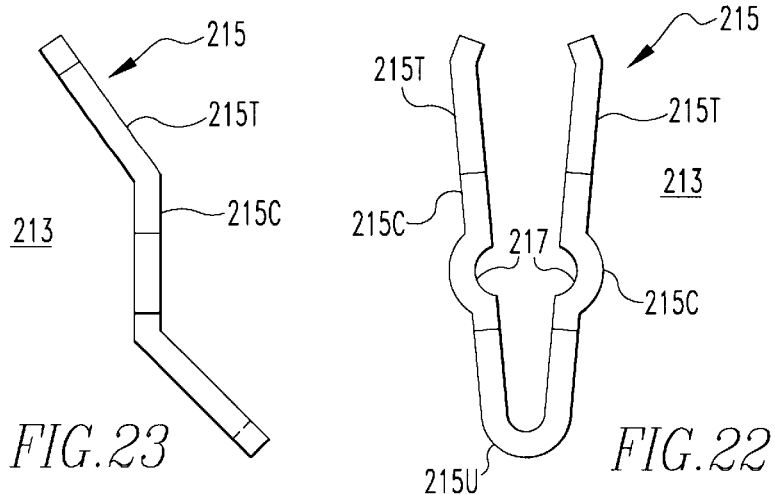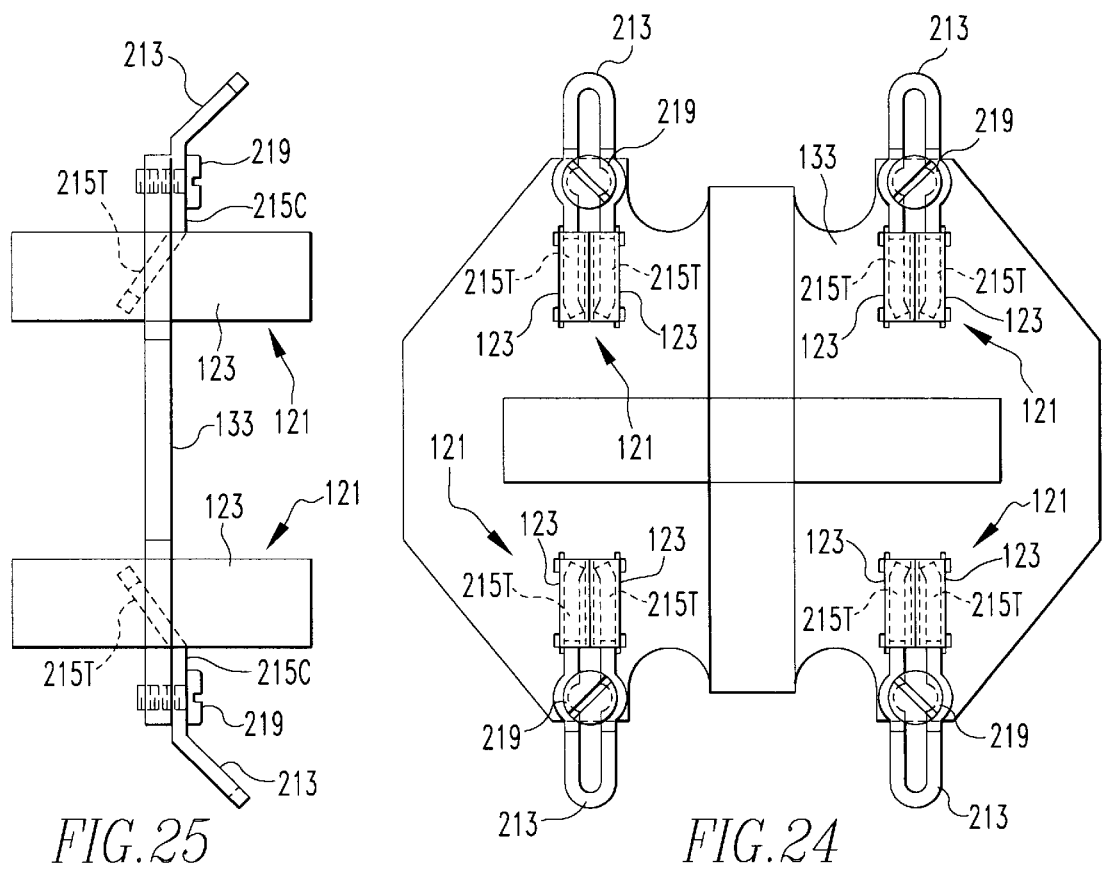

5,951,324

1

SOCKET ASSEMBLY FOR METER CENTER

RELATED APPLICATIONS

Our commonly owned, concurrently filed applications entitled "Fastenerless Double Ended Clip-On Meter Jaw", Attorney Docket Number 97-PDA-452; "Meter Center With Fastenerless Current Carrying Connections", Attorney Docket Number 97-PDA-454; and "Supply Bus Bars For Meter Center", Attorney Docket Number 97-PDA-455.

BACKGROUND OF THE INVENTION

1. Field of the Invention

This invention relates to electric power distribution systems and more particularly to meter centers in which power delivered to multiple users is separately metered. Specifically, it relates to the socket assembly which mounts the meters and connects them to the supply and terminal buses within the meter center.

2. Background Information

Meter centers are used for metering electric power delivered to multiple tenants from a common feeder system. Typically, the meter center includes an upright cabinet forming an enclosure divided into side-by-side meter and disconnect switch compartments. Feeder buses, typically three phase buses and a neutral connected to the utility lines, extend horizontally through the rear of the cabinet. The meter compartment has a pair of vertical supply buses connected to a selected pair of the feeder phase buses by phase balancers, so named because connections can be made to selected phases to generally balance the feeder bus phase currents. The vertical or supply buses can include a neutral bus if the meters have a neutral connection.

A pair of tenant buses for each metered circuit extends horizontally from the disconnect switch compartment into the meter compartment. A meter socket mounts a meter in the meter compartment for each tenant circuit and electrically connects the meter to the supply buses and the tenant buses. Commonly used electrical connections on the meter socket include single ended plug-in jaws which are engaged by stabs on the meter. The connectors which incorporate the plug-in jaws are bolted to the socket plate and to either a supply bus or a tenant bus. The four power conducting connectors have a total of about 20 bolted connections in the current path. Such connections require labor to complete and are subject to heating if they become loose. Providing adequate standoff clearance between, and routing for, the closely spaced orthogonally oriented vertical and tenant buses presents additional challenges in the design of meter centers. Furthermore, proper support must be provided for the socket and the buses to withstand the forces applied during installation and removal of the meter, particularly to prevent shorting of the bus bars.

There is a need, therefore, for an improved meter center which eliminates current carrying joints requiring fasteners which can become loose between the meters and the supply and tenant buses.

There is also a need for such an improved meter center which reduces the labor required to install and remove the meter sockets.

There is an additional need for such a meter center in which the components are firmly supported to prevent displacement during installation and removal of the socket assemblies and meters.

There is a more particular need for a socket assembly which plugs onto the supply and tenant buses.

2

There is a further need for a socket assembly which can be easily and economically assembled.

SUMMARY OF THE INVENTION

These needs and others are satisfied by the invention which is directed to a meter socket assembly comprising the plate member having a plurality of through apertures and double ended fastenerless meter jaws engaged in and extending through the apertures with one end of each double ended meter jaw projecting from first and second sides of the plate member. Preferably, the double ended fastenerless meter jaws have flat elongated members extending through the apertures and confronting tabs bent from these flat elongated members which are spaced apart not more than the preset thickness of the plate member for engaging the first and second sides of the plate member to secure the double ended fastenerless meter jaws in the apertures. Also preferably the double ended fastenerless meter jaws comprise a pair of confronting compliantly spaced apart flat elongated members and the apertures of the plate member have slots engaging the flat elongated members between the confronting tabs. Most preferably, the flat elongated members have lateral projections which engage the slots in the apertures in the plate members. The meter jaws are mounted in the apertures in the plates by inserting one end into the aperture. The outwardly bent confronting tabs cam the elongated members inward so that the tabs pass through the aperture and then the elongated members spring outward so that the confronting tabs engage the opposite faces of the socket plate. The lateral projections engaging the slots in the aperture preclude the elongated members from being squeezed together and disengaging from the socket plate.

The plate member of the meter socket assembly preferably has two pair of apertures with the apertures in each pair laterally spaced and with a corresponding apertures in the two pair aligned. Also preferably, the meter socket assembly is adapted for use with a neutral bus bar. In this case the plate member has a groove across a first face and through which the neutral bar extends. A neutral connector in the second face is connected through the plate member to the neutral bus bar. Preferably the neutral connector is seated in a transverse groove in the second face of the plate member.

BRIEF DESCRIPTION OF THE DRAWINGS

A full understanding of the invention can be gained from the following description of the preferred embodiments when read in conjunction with the accompanying drawings in which:

FIG. 5A is a fractional sectional view through an integral stab contact formed on the supply bus.

FIG. 22 is a top plan view of a horn bypass in accordance with the invention.

FIG. 23 is a side elevation view of the horn bypass of FIG. 22.

FIG. 24 is a plan view of a socket assembly including horn bypasses of the type shown in FIGS. 22 and 23.

FIG. 25 is a side elevation view of the socket assembly of FIG. 24.

DESCRIPTION OF THE PREFERRED EMBODIMENTS

Figure 1:
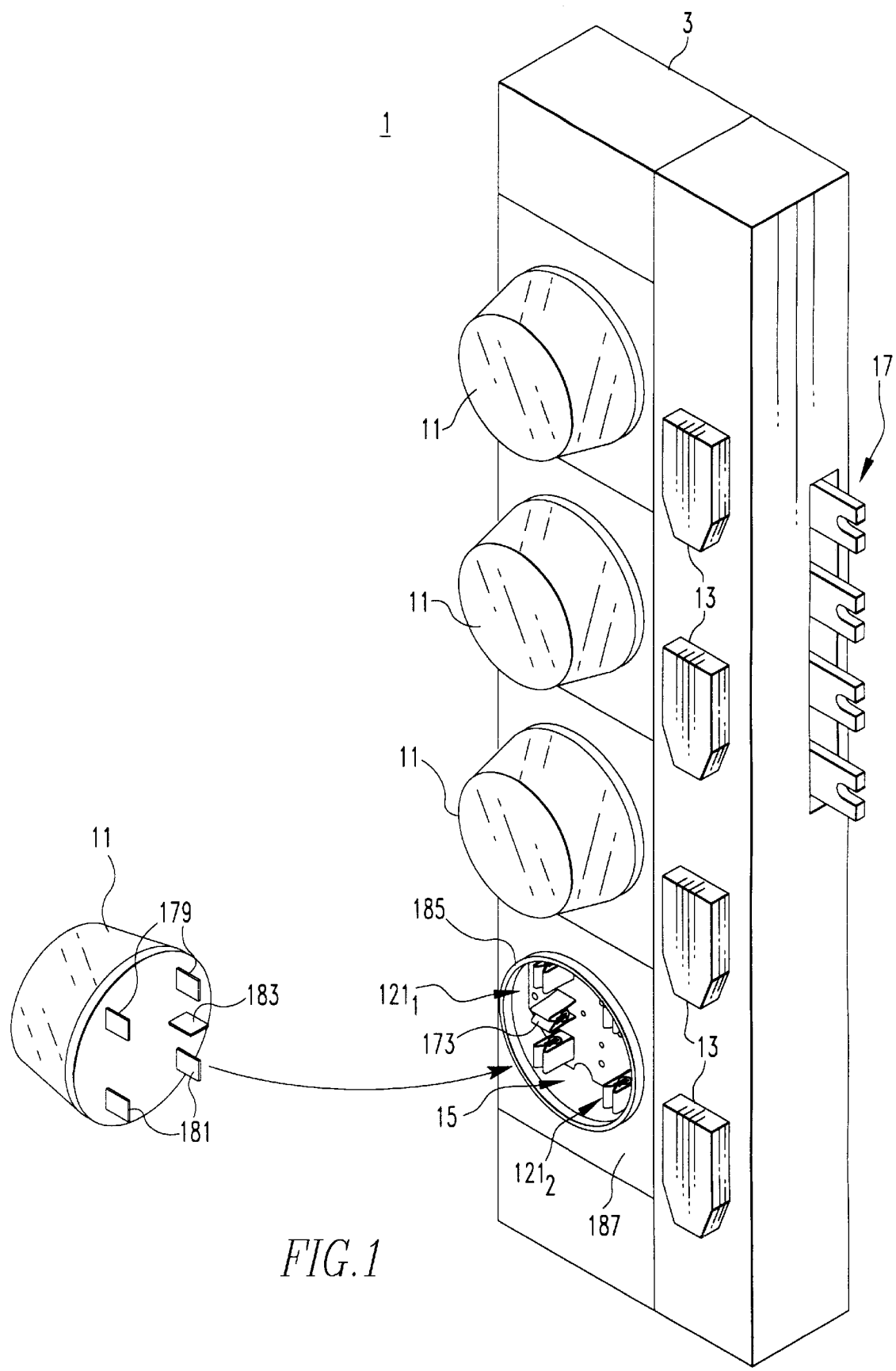
FIG. 1 is an isometric view of a meter center in accordance with the invention shown with one of the meters removed.

Referring to FIGS. 1–4, the meter center 1 of the invention includes a cabinet 3 forming an enclosure which has an internal longitudinal wall 5 which divides the enclosure into a meter compartment 7 and a disconnect switch compartment 9. Mounted in the meter compartment 7 in a manner to be described are a number of meters 11, one for each tenant circuit to be metered. Each tenant circuit is provided with a disconnect switch 13 which may be a circuit breaker mounted in the disconnect switch compartment 9. The meters 11 are supported and electrically connected by socket assemblies 15. While the exemplary meter center accommodates four tenant circuits each served by its own meter, it can be appreciated that the invention is applicable to meter centers servicing other numbers of tenant circuits.

Electric power is provided to the meter center 1 by feeder buses 17 connected to a utility's power distribution system (not shown). In the exemplary meter center, the feeder buses include three phase buses 17A–17C and a neutral bus 17N. These feeder buses 17 extend horizontally through the cabinet 3 and are mounted on a rear wall 19 by spaced apart, vertically extending, insulative supports 21. Each of the feeder buses 17 includes two copper bus bars $17_1$ and $17_2$.

The bus bar $17_1$ is offset at one end $23_1$ and projects beyond the cabinet 3 at the other end $23_2$. The end $23_2$ extends into the gap between the offset end $23_1$ of an adjacent meter center (not shown) and is clamped by a bolt 25 to connect the feeder buses of the side by side meter centers.

Figure 5:
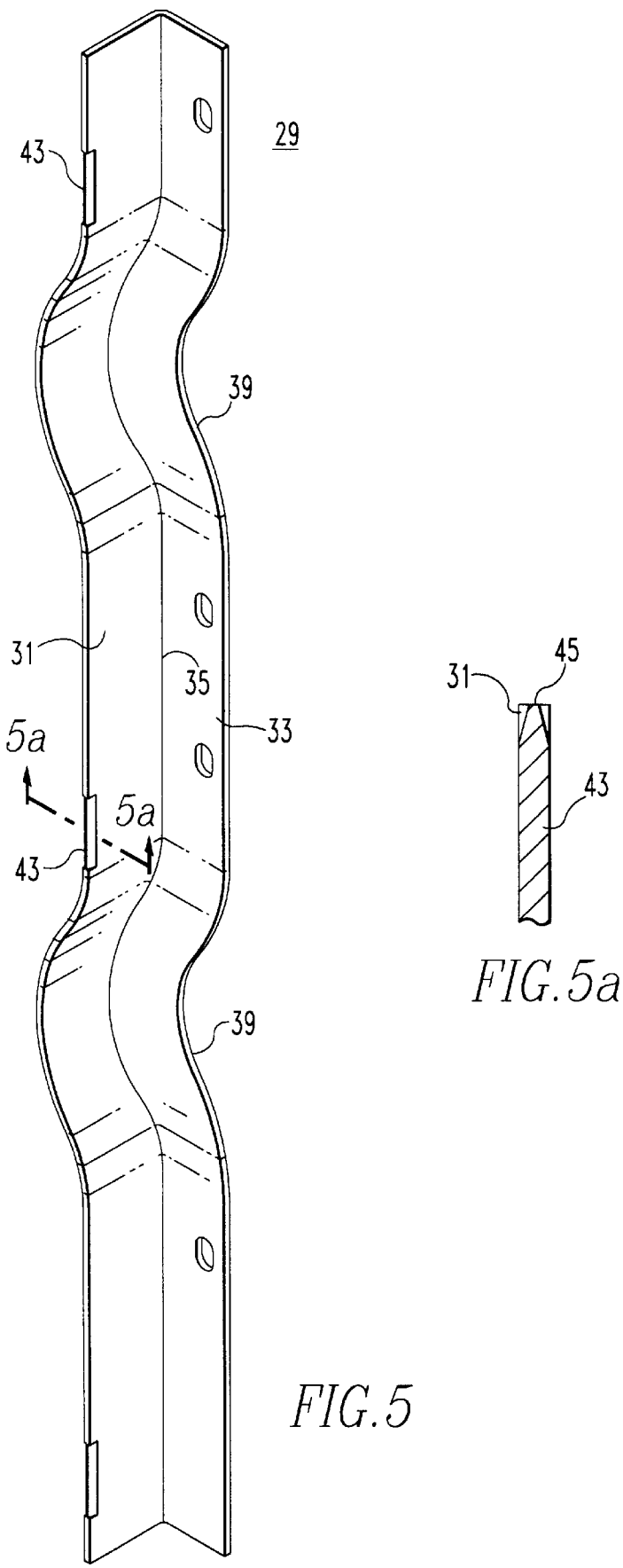
FIG. 5 is an isometric view of a supply bus which forms part of the meter center.

Extending vertically within the meter compartment 7 is a set of supply buses 27 which comprises a pair of laterally spaced apart bus bars 29 in the form of elongated angle members having a first flange 31 and orthogonal second flange 33 integrally joined along a common edge 35 (see also FIG. 5). The pair of supply buses 29 are supported in spaced relation with the second flanges 33 in a common plane by modular insulative supports 37 which will be described in detail. These supply buses 29 have offset sections 39 which preferably extend laterally in a direction parallel to the common plane formed by the second flanges 33 for a purpose to be described. Also preferably, these offset sections 39 are arcuate. Between the offset sections 39 of the supply buses 29 are straight sections 41 which extend in a first direction (vertically). At spaced locations along the first flanges 31 of the supply bus bars 29 are integral supply bus stab contacts 43 which are formed by bevelling the free or engagement edges 45 of the flanges 31 (see FIG. 5A). In the preferred embodiment of the invention, these supply bus stab contacts 43 are formed on the straight sections 41 of the flanges 31.

The supply bus bars 29 are each electrically connected to one of the feeder buses 17 by phase balancers 47. In the example, the left supply bus 29L is connected to the phase A feeder bus 17A by the phase balancer 47A which is formed by a cylindrical sleeve 49 and a bolt 51. The other supply bus bar 29R is electrically connected to the phase B feeder bus bar 17B by the phase balancer 47B which includes a Z member 53 and bolts 55. Adjoining meter centers (not shown) can be connected by similar connections to other combinations of the feeder bus bars 17A–17C to balance out the phase currents in the feeder buses.

Figure 6:
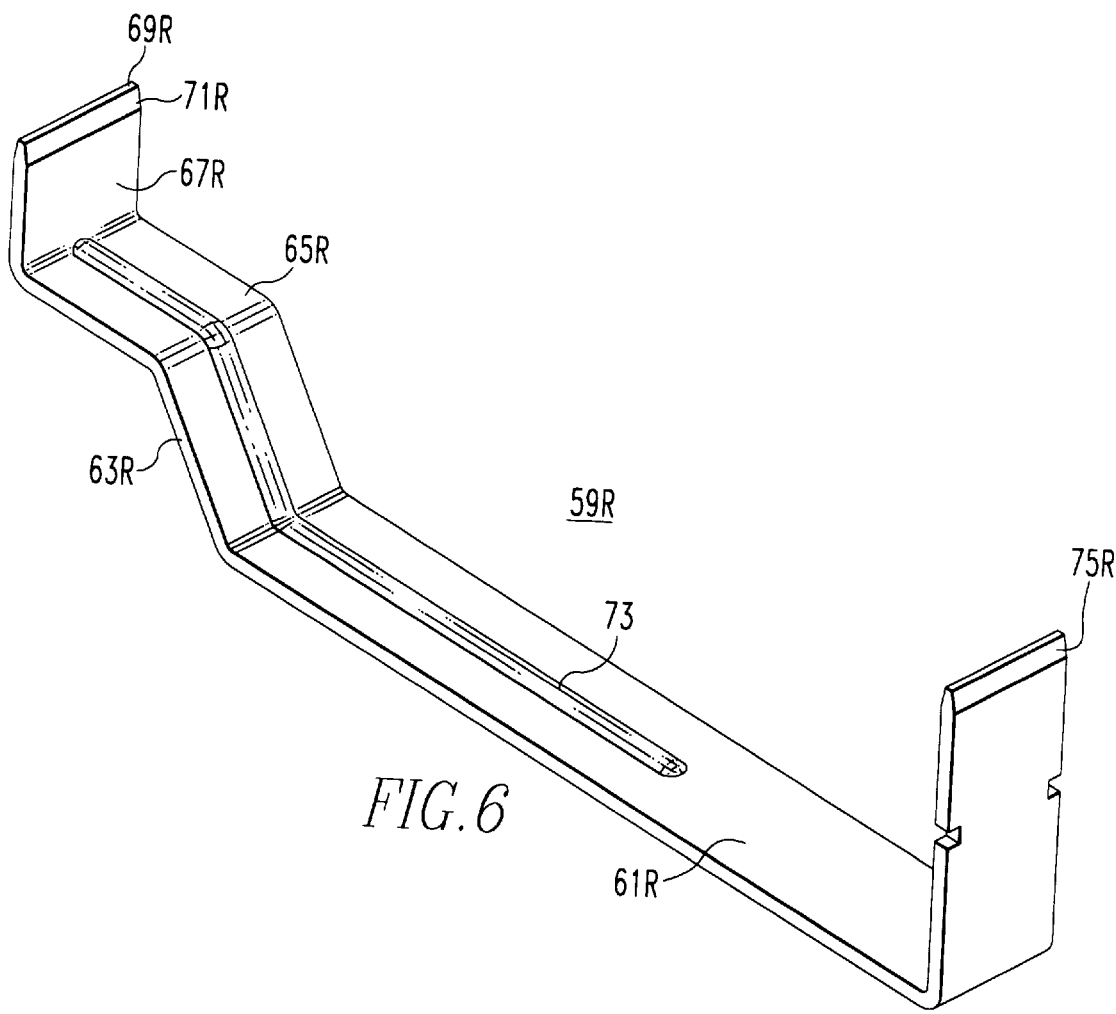
FIG. 6 is an isometric view of the rear tenant bus of the meter center.

Each of the tenant circuits for which the meter center 1 provides metered power has a set of tenant bus bars each of which includes a front bus bar 59F and a rear tenant bus bar 59R. The tenant bus bars 59F and 59R are stacked in planes parallel to the common plane formed by the second flanges 33 of the supply bus bars 29 and extend horizontally into the meter compartment 7 from the disconnect switch compartment 9 through the wall 5. In the exemplary meter center 1, each set of tenant bus bars is aligned with an offset section 39 of the supply bus bars 29. Each of the tenant buses 59 comprises an elongated flat member. As best seen in FIGS. 3 and 6, the rear tenant bus 59R has a main section 61R which extends behind the right supply bus 29R and then extends angularly forward at 63R to a point in front of the flange 33 on the left supply bus 29L. It then extends horizontally at 65R and terminates in a forwardly directed terminal flange 67R. This terminal flange 67R has an engagement edge 69R extending in the first direction (vertically) which forms an integral tenant stab contact 71R. As can be seen from FIG. 2, the tenant stab contact 71R projects into the offset 39 in the left supply bus bar 29L and is aligned in the first direction (vertically) with the supply bus stab contact 43 on the bus bar 29L.

Figure 7:
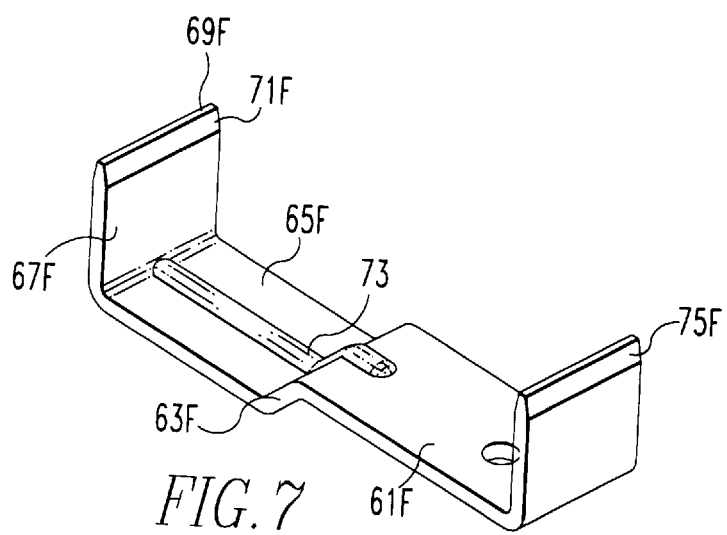
FIG. 7 is an isometric view of a front tenant bus.

Similarly, the front tenant buses 59F, as best seen in FIGS. 3 and 7, are each flat members having a main section 61F which extends through the wall 5, an offset section 63F angling rearward, a horizontal section 65F and a terminal flange 67F forming on an engagement edge 69F the tenant stab contact 71F which is aligned in the offset section 39 with the corresponding supply bus stab contact 43 at the offset in the right supply bus 29R. The tenant supply buses 59 are stiffened by a longitudinally extending ridge 73. The ends 75F and 75R of the tenant buses within the disconnect switch compartment 9 are supported in a molded bracket 77 and form stab contacts for the disconnect switches 13. FIG. 4 illustrates a modification to the tenant buses 59' wherein the disconnect switch stab 75 are replaced by bolts 79 for threaded connection to the disconnect switch.

It can be appreciated that the offset sections 39 of the supply buses 29 permit the tenant stab contacts 71 to be aligned with the supply bus stab contacts 43. While in the preferred embodiment of the invention, the supply bus stab contacts 43 are located on the straight sections 41 of the forward projecting flanges 31 of the supply buses 29, and the tenant bus stab contacts project into the lateral offsets 39, it can be appreciated that the supply stab contacts could be provided on the offset sections of the flanges 31 in which case the tenant stab contacts would project toward straight sections 41 of the supply buses 29 but would be aligned with the offset supply bus stabs. Other arrangements of the supply and tenant bus bars could also be used. For instance, the first flanges on the supply bus bars need not be continuous but could be provided only at the locations of the supply bus stab contacts. However, the continuous flange 31 is preferred as it provides increased rigidity for the supply buses 29.

Figure 8:
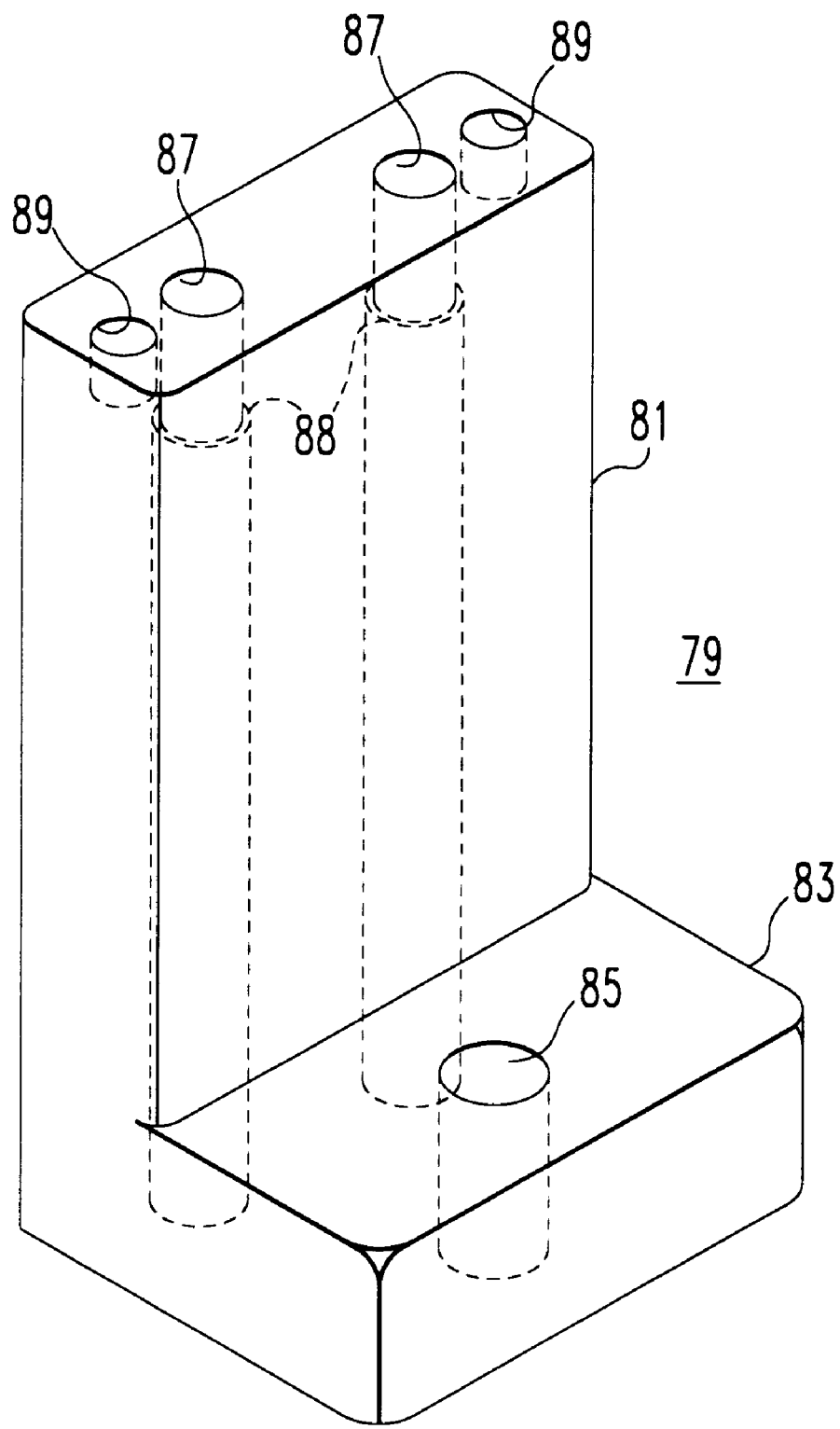
FIG. 8 is an isometric view of a molded base insulator which forms part of the modular insulator supports for the supply and tenant buses.
Figure 9:
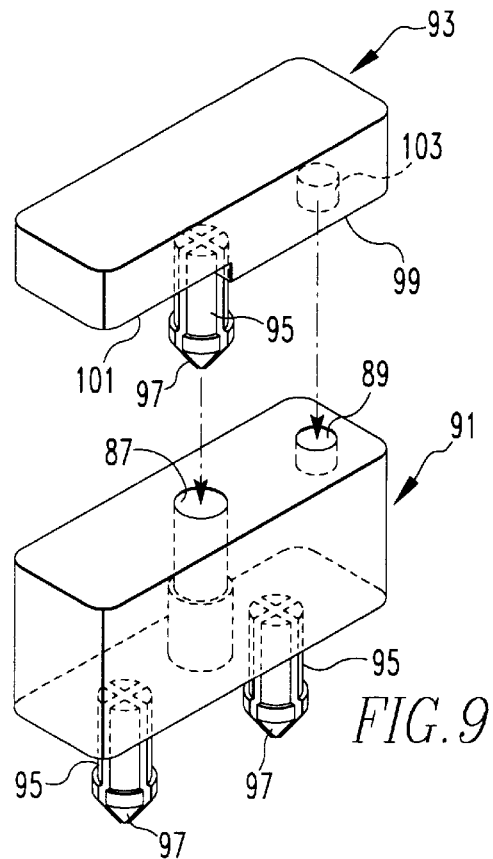
FIG. 9 is an isometric view of two additional modular units of the modular insulator supports.
Figure 10:
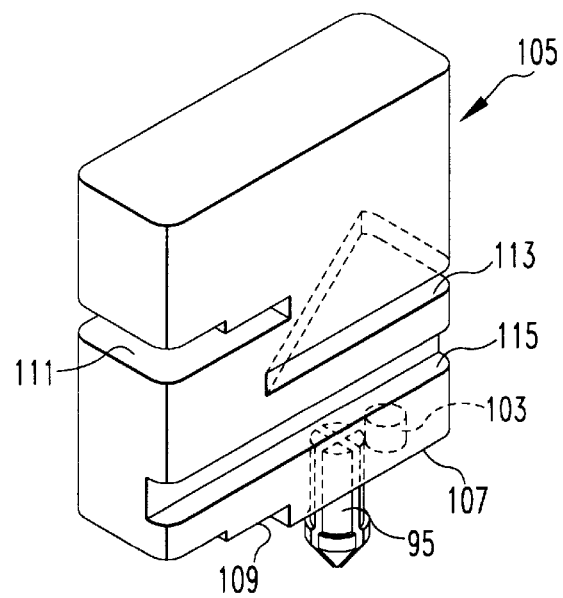
FIG. 10 is an isometric view of yet another one of the units of the modular insulator supports.

As mentioned, the supply buses 29 and tenant buses 59 are supported, at least in part, by modular insulative supports 37. Components of these modular insulative supports 37 are shown in FIGS. 8–10. A base support member 79 is shown in FIG. 8. This base support member 79 has an upright elongated body 81 and an integral mounting flange 83 with an aperture 85 for a mounting screw (not shown). The body 81 has a pair of longitudinal bores 87 which are counter-bored from the bottom to form shoulders 88. The body 81 also has a pair of blind bores 89 in the top.

FIG. 9 illustrates two additional modular pieces 91 and 93 which form part of the modulator insulative supports 37. The member 91 is a spacer which has one counterbored aperture 87 and a single blind bore 89. The spacer 91 also has a pair of integral, multi-pronged compliant fingers 95 projecting axially and having bevelled undercut heads 97.

The cap member 93 has a bottom mounting face 99 with a stepped down section 101. The cap also has one of the integral, multi-pronged compliant fingers 95 on the mounting face 99. There is also a locating pin 103 projecting from the mounting face 99.

FIG. 10 shows yet another modular insulative support member 105. This part, 105, also has a bottom mounting face 107 with a two level stepped down section 109 adjacent one end. An integral, multi-pronged compliant finger 95 and locating pin 103 project from the bottom mounting face 107. The part 105 also has in one end a stepped slot 111. In addition, extending inward from the opposite end of part 105 is an angled slot 113. Between the angled slot 113 and the mounting face 107 is a groove 115 in the side face of the modular support member 105 which provides a suitable creep distance over the surface of the insulator.

Figure 11:
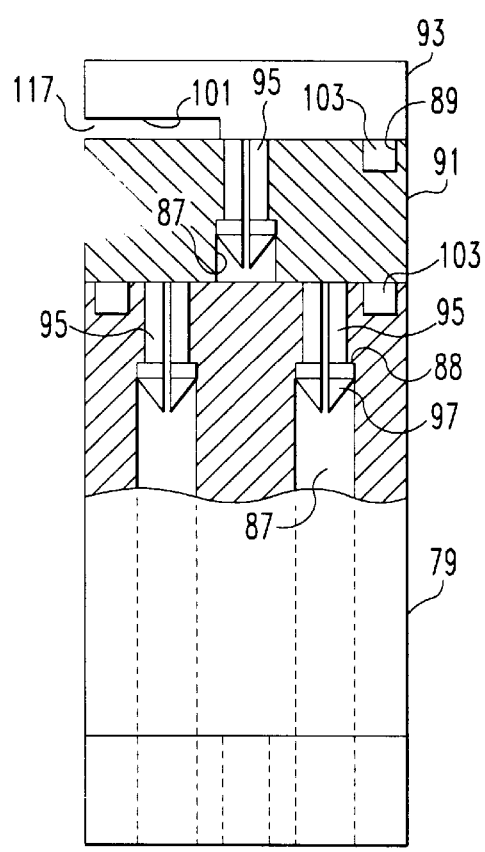
FIG. 11 is an elevation view with some parts sectioned showing the units of FIGS. 8 and 9 interlocked.
Figure 12:
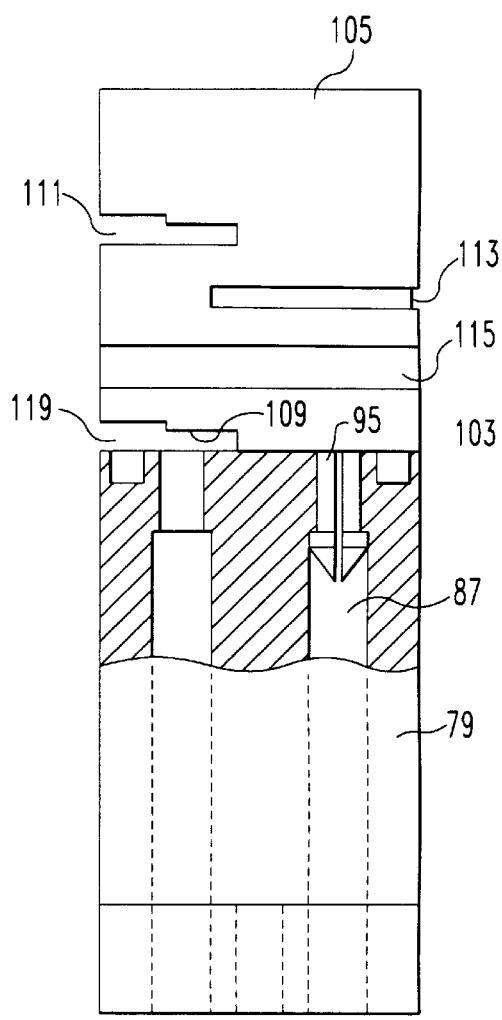
FIG. 12 is a front elevation view with some parts in section of a support formed by interlocking the units of FIGS. 8 and 10.

FIGS. 11 and 12 illustrate how the modular parts 79, 91, 93 and 105 can be interlocked to form insulative supports with different configurations. For instance, as shown in FIG. 11, the spacer 91 can be interlocked with the base member 79 by inserting the multi-pronged compliant fingers 95 on the spacer 91 into the counterbored borer 87 in the base member. The compliant fingers 95 squeeze together as the bevelled heads 97 are inserted in the bores 87 and then expand as the undercut heads engage the shoulders 88 to interlock the spacer 91 and base member 79. The single multi-pronged compliant finger 95 on the cap member 93 then engages the single bore 87 in the top of the spacer 91 to lock the cap member 93 to the spacer. The locating pin 103 on the cap member 93 engages the blind bore 89 in the top of the spacer which prevents rotation of the cap member around the finger 95. It can be seen from FIG. 11 that the stepped down section 101 on the cap member 93 forms with the spacer 91 a slot 117. As shown in FIG. 12, the support member 105 can be similarly locked to a base member 79 by a finger 95 and pin 103 so that the step downs 109 in the member 105 form with the top of the base member 79 a stepped slot 119.

Figure 2:
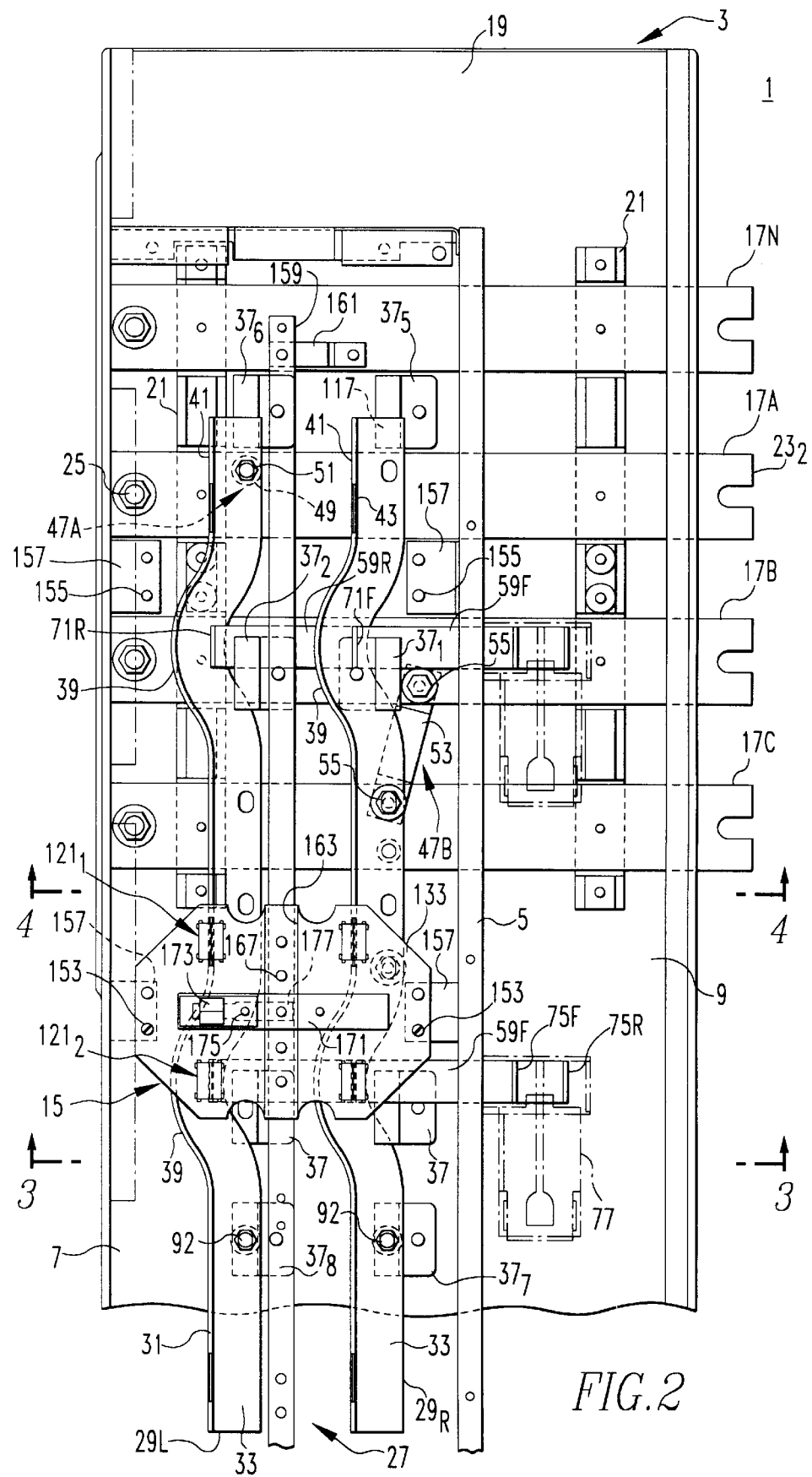
FIG. 2 is a front elevation view of the upper part of the meter center of FIG. 1 with the front covers removed.
Figure 3:
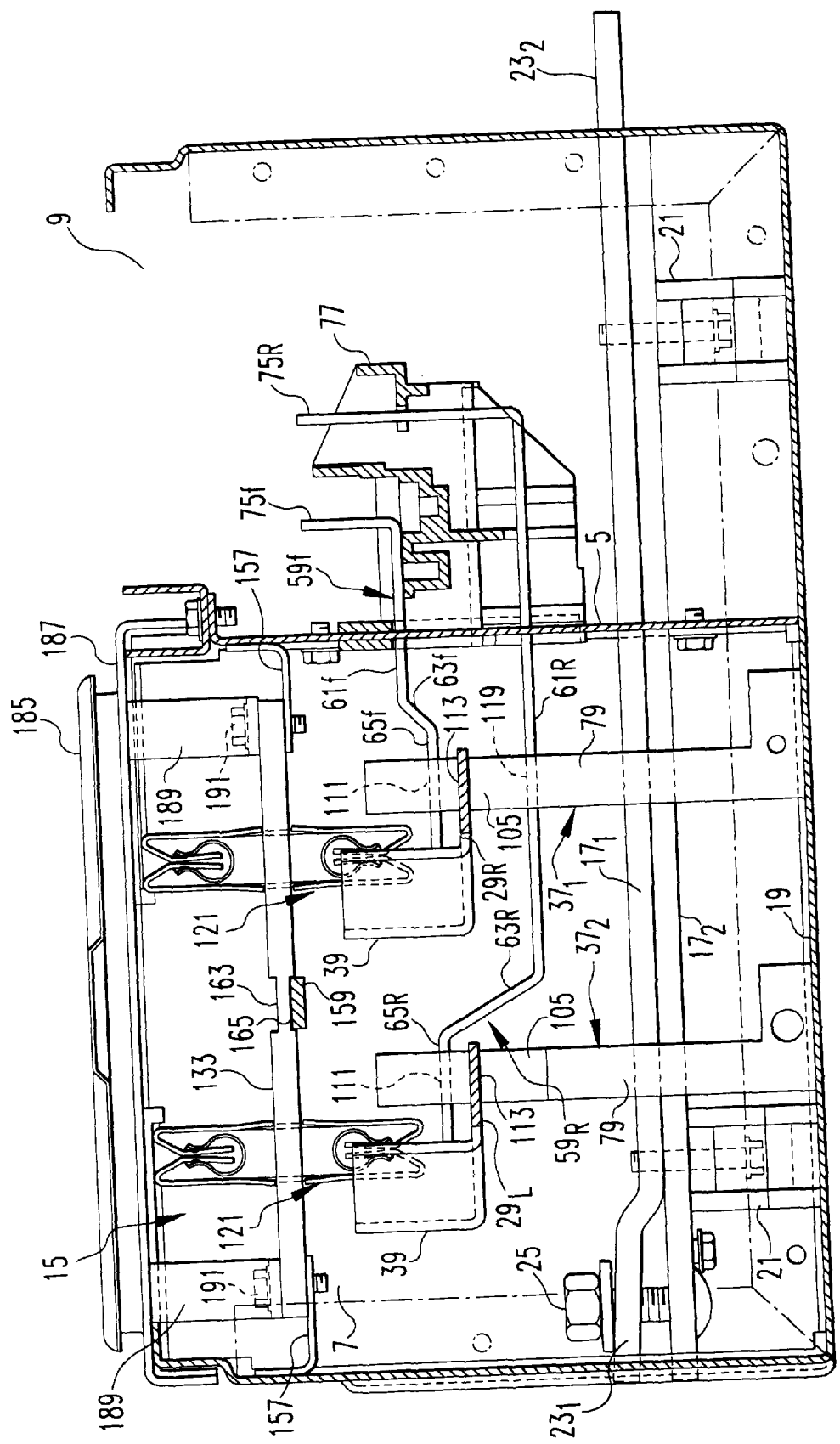
FIG. 3 is a horizontal sectional view through the meter center taken along the line 3—3 in FIG. 2.
Figure 4:
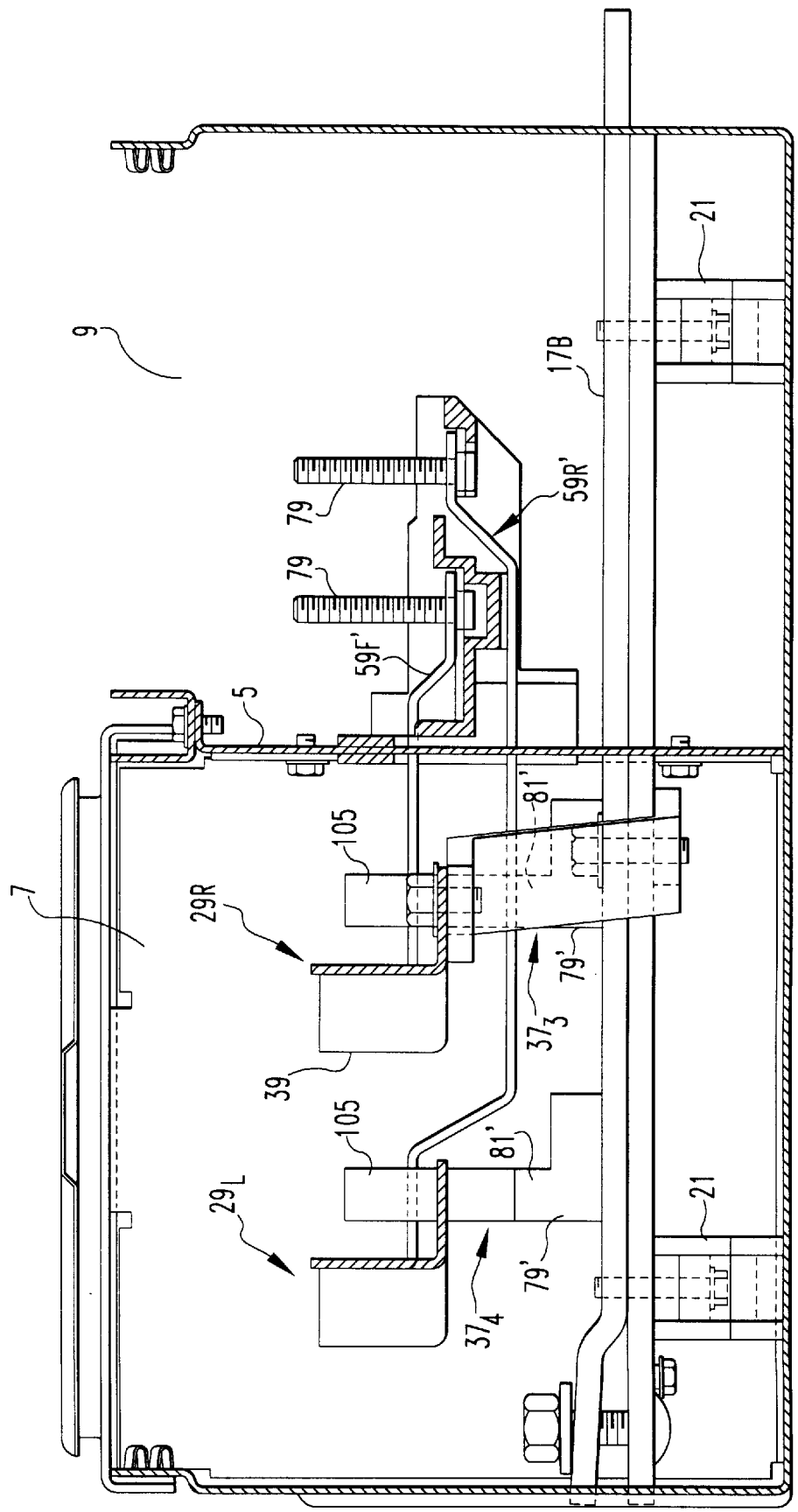
FIG. 4 is a horizontal cross sectional view through the meter center taken along the line 4—4 in FIG. 2.

Turning to FIGS. 2 and 3, it can be seen that a modular insulative support 37, formed by interlocking a base member 79 and a unit 105 supports the rear tenant bus 59R in the slot 119 formed between the components 79 and 105 and the forward tenant bus bar 59F in the slot 111. The arcuate offset section 41 of the right supply bus bar 29R is engaged by the angular slot 113. In this particular support $37_1$, the base is secured to the rear wall 19 of the compartment. A similarly configured modular support $37_2$ also mounted to the rear wall 19 supports the front tenant bus bar 59F in the slot 111 and the offset section 39 of the left supply bus bar 29L in the angled slot 113. As can be appreciated, the steps in the slots 111 and 119 accommodate for the ribs 73 in the tenant bus bars.

It can be appreciated from FIG. 2 that the upper set of tenant bus bars are in line with the feeder bus bars 17B so that the supports 37 for these bus bars cannot be secured to the rear wall 19. Accordingly, as shown in FIG. 4, the modular supports $37_3$ and $37_4$ have a modified base member 79' which includes a shorter body section 81'. This shorter base member 79' is in all other respects the same as the base member 79. The base members 79' are secured to the feeder bus bars 17B with the support $37_3$ engaging the tenant bus bars 59R and 59F and the right supply bus bar 29R in the manner similar to that of $37_1$. In like manner, the unit 105 on the support $37_4$ supports the rear tenant bus bar 59R and the left hand supply bus 29L in the same manner as the support $37_2$ except that the base member 79' is secured again to the B phase feeder bus 17B. The upper ends of the supply buses 29 are supported in modular supports $37_5$ and $37_6$ (see FIG. 2) which are configured as shown in FIG. 11 with the flanges 33 of the supply bus bars engaged in the slots 117. The bases of these modular supports $37_5$ and $37_6$ are secured to the rear wall 19 of the cabinet 3. Modular supports similar to $37_1$ and $37_2$ can be utilized to support additional sets of tenant bus bars 59 and at those locations the supply bus bars also. The supports $37_7$ and $37_8$ comprise a base unit 79 and a spacer 91 with a self threading screw 92 engaging the bore 87 in the spacer to secure the flanges 33 of the supply buses 29.

Figures 13, 14, 15:
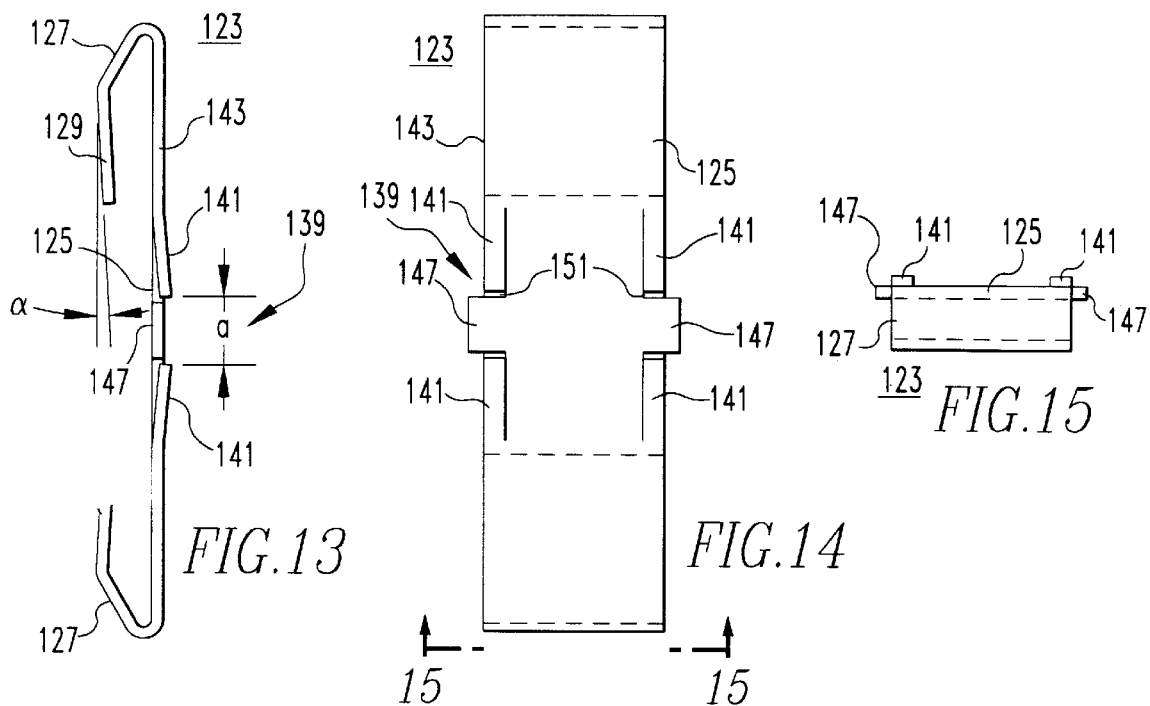
FIG. 13 is a side elevation view of a formed elongated member which forms part of a double ended fastenerless plug-in jaw in accordance with the invention.
FIG. 14 is a rear elevation view of the elongated member of FIG. 13.
FIG. 15 is a bottom plane view of the elongated member of FIGS. 13 and 14.
Figure 16:
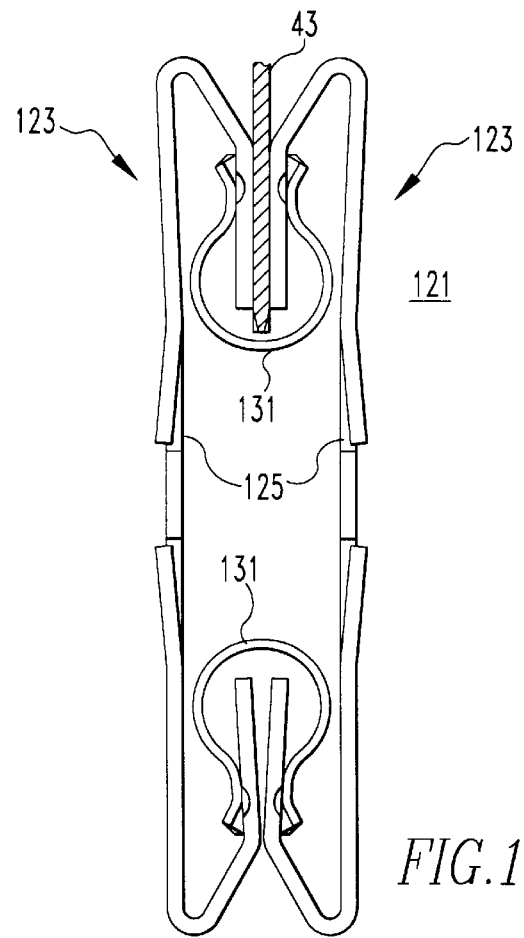
FIG. 16 is a front elevation view of a double ended plug-in jaw formed from two of the elongated members of FIGS. 13–15.

As previously described, a meter socket assembly 15 is provided at each set of tenant buses 59 for mounting a meter 11 which electrically connects the tenant buses to the supply buses 29. One of the unique features of the meter socket assemblies 15 is that they can plug into the supply 29 and tenant 59 bus bars while also providing plug-in connections for the meters. This feature is primarily provided by the double ended fastenerless meter jaws 121 which are shown in FIG. 16. Each of the meter jaws 121 includes a pair of electrically conductive elongated flat members 123 (see FIGS. 13–15). These flat members 123 each have a generally straight center section 125 and end sections 127 at each end which are bent back on but diverge from the center section. Terminal sections 129 extend generally toward each other from the end sections. The terminal sections 129 of the pair of elongated members 123 are clamped together in compliant confronting relationship by a pair of spring clips 131. As shown in FIG. 16, the end sections 127 form a guide which centers the jaw on a stab contact such as a supply bus stab contact 43 which then wedges between the terminal sections. As seen in FIG. 13, preferably the terminal sections converge inward toward the center section 125 of the elongated flat members 123 at an angle $\alpha$. When a stab contact, such as 43, wedges the terminal sections 129 apart, the center section 125 of the flat elongated members 123 bend outward. This rotates the terminal sections 129 inward toward each other. The angle $\alpha$ is selected such that with this rotation the terminal sections 129 are parallel to the sides of the stab 43, thereby reducing meter pull out pressure while maintaining better electrical contact. Typically, this angle $\alpha$ can be between about two-five degrees and in the exemplary meter jaws is about three degrees.

Figure 17:
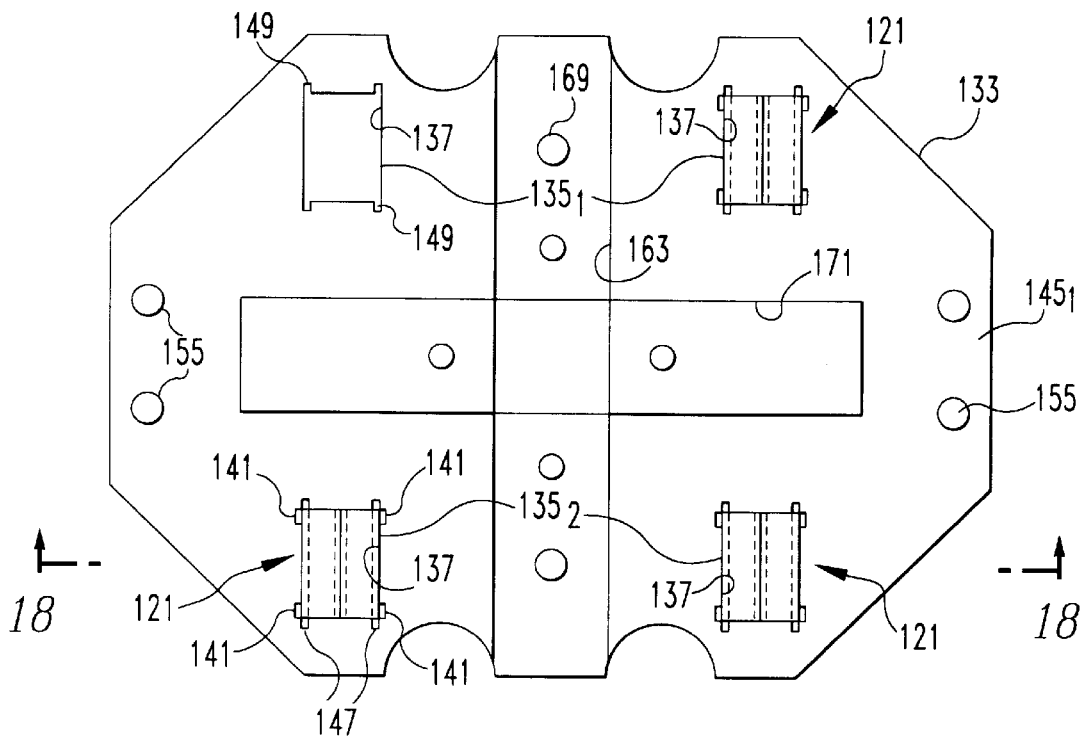
FIG. 17 is a top plane view of a socket assembly which incorporates three of the double ended fastenerless plug-in jaws shown in FIG. 16.
Figure 18:
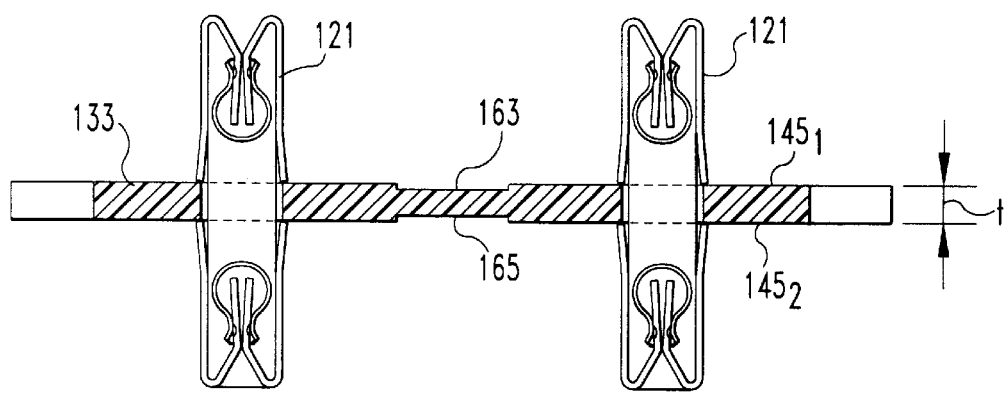
FIG. 18 is a cross sectional view of the socket assembly taken along the line 18—18 in FIG. 17.

The double ended fastenerless meter jaws 121 are mounted in an electrically insulative socket plate 133 of the socket assembly 15 as shown in FIGS. 17 and 18. The socket plate 133 has two pair $135_1$ and $135_2$ of rectangular through apertures 137. The apertures of each pair 135 are laterally aligned and the corresponding apertures in the two pair are vertically aligned.

Returning to FIGS. 13–16, the flat elongated members 123 of the meter jaws 121 have pairs 139 of confronting tabs 141 bent out of the plane of the center section 125. Preferably, such pairs 139 of tabs 141 are provided along each side edge 143 of the flat elongated members 123. The spacing, a, between the confronting tabs 141 is slightly less than, but in any event no greater than, the thickness, t, of the socket plate 133 (see FIGS. 13 and 18). The jaws 121 are mounted in the apertures 137 by pushing one end of the jaw into the aperture. The camming surface provided by the tabs 141 adjacent that end of the jaw squeeze the flat elongated members 123 together until those tabs pass through the aperture 137 and the center sections 125 spring outward so that the confronting tabs of each pair 139 engage the first and second surfaces $145_1$ and $145_2$ of the socket plate 133 and thereby secure the jaws 121 in the apertures 137 without the use of fasteners. By fasteners it is meant devices such as screws and the like which require tightening to engage and which can come loose.

The center sections 125 of the flat elongated members 123 have lateral extensions 147 projecting outward between the pairs 139 of tabs. These lateral extensions engage slots 149 in the corners of the apertures 137. A slight gap 151 is provided between the lateral projections 147 and the ends of the tabs 141 so that the tabs can pass through the aperture and spring outward to align the lateral projections 147 with the grooves 149.

Referring to FIG. 2, the socket assembly 15 is mounted by aligning the pair of meter jaws $121_2$ with the tenant stab contacts 71R and 71F of the selected tenant circuit. In a like manner, the pair of meter jaws $121_1$ are aligned with the supply bus stab contacts 43 associated with the selected tenant circuit. Pressure is then applied to the socket plate 133 to force the meter jaws into engagement with the corresponding stab contacts. The modular supports 37 play an important role at this point in providing a stable support for the supply 29 and tenant bus 59 bars so that the bus bars remain firmly in place while the socket assembly 15 is being engaged. It is especially important that the bus bars 29, 59 not be deflected to the point where there could be a short circuit. The socket assembly 15 is retained in place by fasteners 153 which engage apertures 155 and brackets 157 mounted in the cabinet.

Where required, a neutral connection for the meter socket is also provided. In such instances, a neutral supply bus 159 extends vertically between the supply phase buses 29R and 29L. As shown in FIG. 2, the upper end of the neutral supply bus 159 is mechanically supported by and electrically connected to the neutral feeder bus 17N by a connector 161. As can be seen from FIGS. 3, 17 and 18, the socket plates 133 have vertically extending grooves 163 and 165 in each face $145_1$, $145_2$. The neutral bar 159 is secured in the groove 165 in the rear faces $145_2$ of each of the socket plates 133 by fasteners 167 which extend through apertures 169 in the socket plate. The socket plates 133 also have enclosed horizontal grooves 171 intersecting the vertical grooves 163. As shown in FIG. 2, a single ended fastenerless jaw 173 is seated in the horizontal groove 171 in the front face of the socket plate 133 by a fastener 175. The single ended neutral jaw 173 is aligned with the left hand supply and tenant double ended jaws but rotated 90°. A connector 177 seated in the rear horizontal groove 171 electrically connects the neutral jaw 173 with the neutral bus 159. Alternatively, the neutral jaw 173 can extend to the right in the groove 171, or up or down in the groove 163 depending upon the orientation of the neutral stab in the meter to be used. While prior art fasteners are utilized in the exemplary embodiment of the invention for the neutral connections, the neutral currents are typically low and therefore do not generate the same concerns as fasteners in the phase current paths.

Referring to FIG. 1, the meters 11 have a pair of supply stabs 179 which engage the pair of meter jaws $121_1$ in the socket assembly 15 connected to the supply buses 29, a pair of meter tenant stabs 181 which engage the tenant meter jaws $121_2$ in the socket assembly, and a horizontally oriented neutral stab 183 which engages the neutral jaw 173. The stabs 179, 181 and 183 not only electrically connect the meter between the supply 29 and tenant buses 59 but also mechanically retain the meter 11 in place. The meter 11 seats in a support ring 185 which is formed in a front plate 187 mounted to the brackets 157 through stand offs 189 by fasteners 191 which also pass through the socket plates 133 (see FIG. 3). The modular supports 37 also provide stability for the supply buses 29 and tenant buses 59 when the meters 11 are being plugged in and removed.

Figure 19:
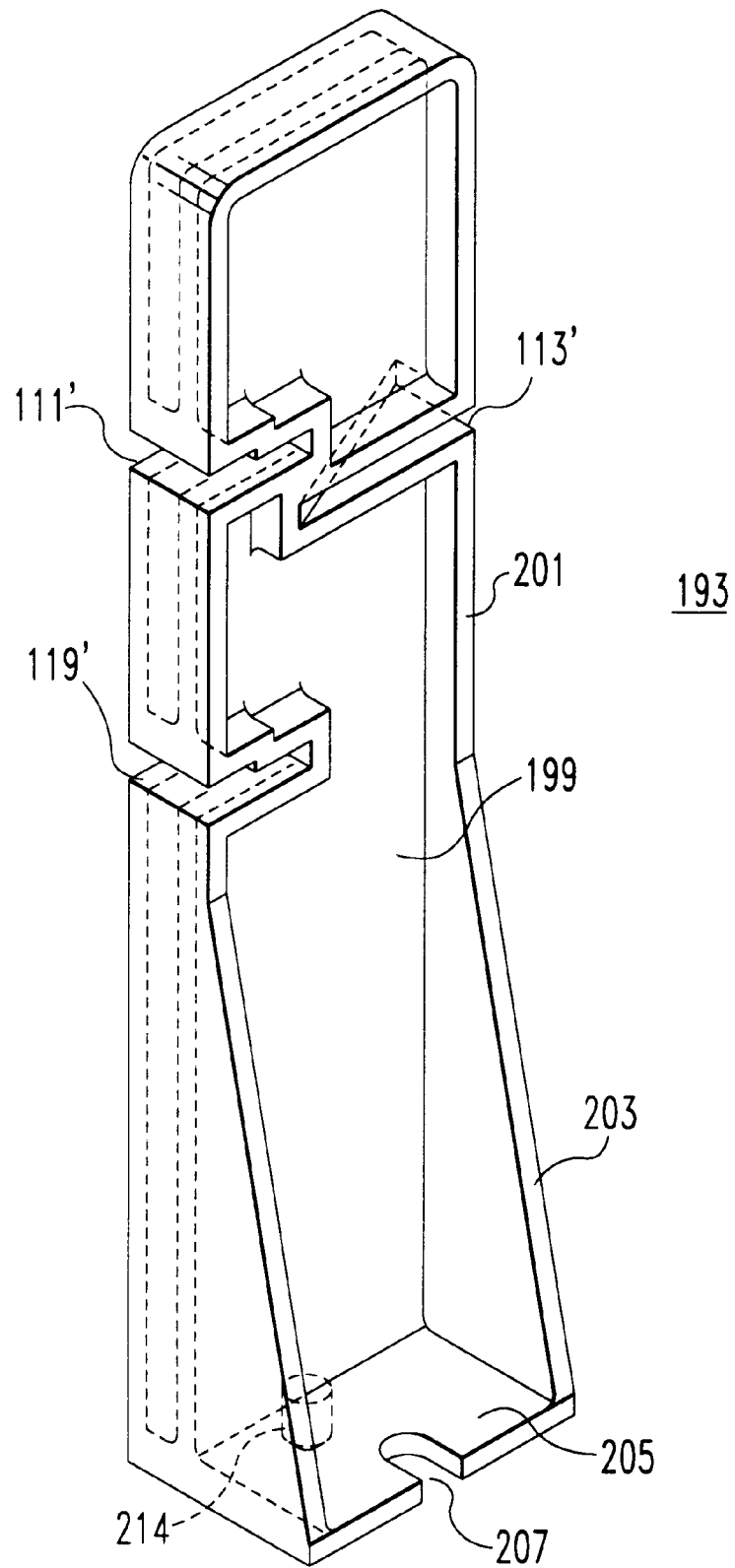
FIG. 19 is an isometric view of one insulative support of a set of supports in accordance with another embodiment of the invention.
Figure 21:
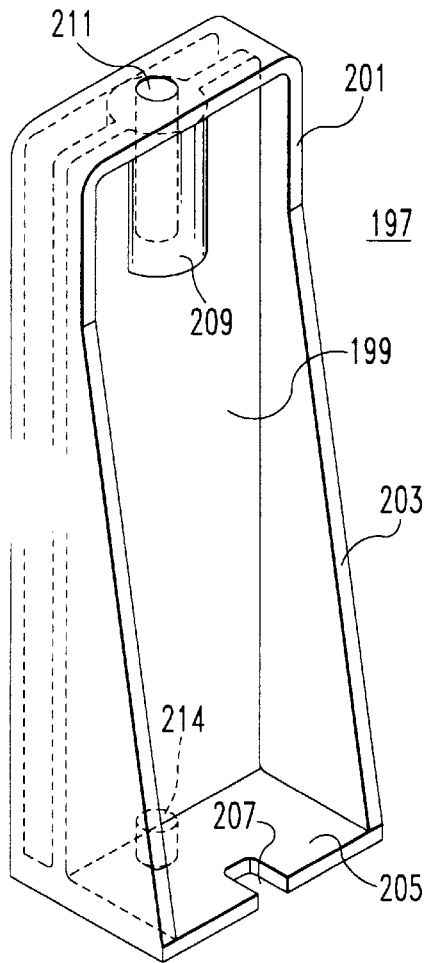
FIG. 21 is an isometric view of a third insulative support of the set.
Figure 20:
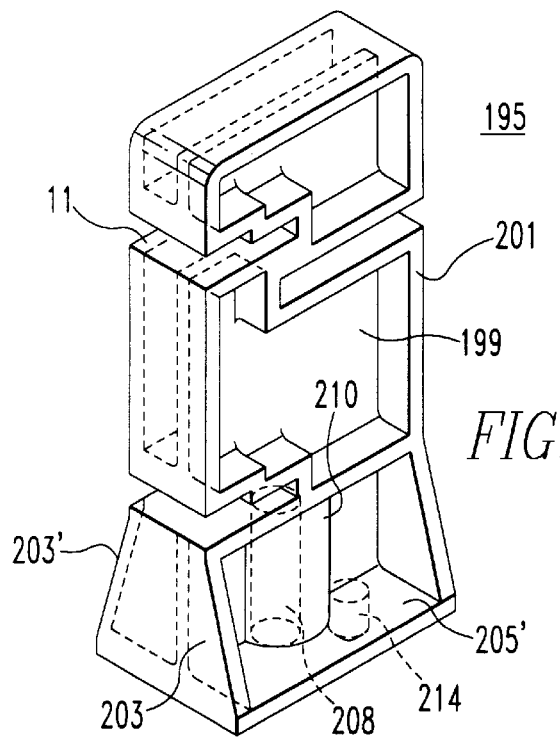
FIG. 20 is an isometric view of a second insulative support of the set.

An alternative form of the insulative supports is illustrated in FIGS. 19–21. In this embodiment of the invention, three separate insulative supports 193, 195 and 197 are each molded as a single piece. Each of these supports have an upright planar member 199 bounded around its edges by a flange 201 giving the supports an I-beam construction which provides strength and rigidity. This flange flares out at 203 to engage a base 205 having a notch 207 for a fastener for securing the support within the closure or to a feeder bus. The base 205' in the shorter support 195 extends laterally from both sides of the planar member 199 to provide a more stable base. The edge flange 201 flares outwardly on both sides 203 and 203' to join this wider base.

The one piece support 193 has a pair of stepped grooves 111' and 119' on one side which correspond to and are spaced by the same distance as the grooves 111 and 119 in the modular support shown in FIG. 112. A slot 113' extends on an angle through the other side of the planar member and corresponds to the groove 113. The edge flange 201 is continuous around the edges of the grooves 111', 113' and 119'. The single piece support 193 is similar in height to and can be used in place of the supports $37_1$ and $37_2$ shown in FIG. 3 which comprise an assembly including the tall base module 79 of FIG. 8, and the member 105 shown in FIG. 10, which together make the support shown in FIG. 12.

The single piece support 195 shown in FIG. 20 can be used in place of the supports 37₃ and 37₄ shown in FIG. 4 which are made up of a short base member 79' and the modular unit 105. This support also has stepped grooves 111' and 119' in addition to a slot 113' for supporting the tenant and supply buses. Rather than having a slot such as 207 in the base for mounting, the support 195 has a brace 208 in a cylindrical boss 210 into which a fastener (not shown) is threaded from underneath.

The one piece support 197 shown in FIG. 21 can be used in place of the supports 37₇ and 37₈ shown in FIG. 2. A cylindrical section 209 accommodates a bore 211 in the top face which receives the mounting screw 92.

As the bases 205 have a notch 207 for only one fastener, a pin 214 is molded to the bottom of the supports 193, 195 and 197 to fix the supports rotationally.

It is often desirable to remove a meter 11 without interrupting power to the tenant buses. Horn bypasses 213 provided for this purpose are shown in FIGS. 22 and 23. The horn bypass member 213 is an electrically conductive, compliant U-shaped member having a pair of legs 215. The legs 215 have a parallel Z configuration with terminal sections 215T extend between the compliant elongated members 123 of the double ended fastenerless meter jaws 121. The center sections 215C of the legs seat on the socket plate 133 and are formed with facing semicircular recesses 217 through which a fastener 219 passes to firmly secure the horn bypass. The U section 215U of the horn bypass extends upward at approximately a 45° angle from the socket plate for connection of a jumper cable (not shown). As shown in FIGS. 24 and 25, the horn bypasses 213 are provided in each of the doubled ended fastenerless meter jaws 121. The terminal sections of the legs 215T are squeezed together and inserted between the members 123 of the fastenerless meter jaws 121. When released, the legs wedge outward to make electrical contact and mechanical engagement with the members 123. The fasteners 219 only prevent the horn bypasses from being inadvertently pulled out of engagement with the members 123. Before removing the meter, a jumper (not shown) is connected between the jaw 121 (upper left in FIG. 24) connected to the supply bus 29L and the jaw 121 (lower left) connected to the rear tenant bus 59R. Another jumper (also not shown) is connected between the jaws 121 connected to the supply bus 29R (upper right) and the tenant bus 59F (lower right). These horn bypasses also provide fastenerless electrical connections in the current path. The screws 219 only mount the horn bypasses 213 and are not in the current path.

While specific embodiments of the invention have been described in detail, it will be appreciated by those skilled in the art that various modifications and alternatives to those details could be developed in light of the overall teachings of the disclosure. Accordingly, the particular arrangement disclosed are meant to be illustrative only and not limiting as to the scope of invention which is to be given the full breath of the claims appended and any and all equivalents thereof.

What is claimed is:

1. A horn bypass member adapted for use with a meter socket including a plurality of meter jaws each having a pair of spaced apart elongated conductive members each having an inner region, said horn bypass member comprising: a U-shaped, electrically conductive compliant member having a pair of legs which wedge outward and each of which make electrical contact with said inner region of one said spaced elongated condutive members.

2. The horn bypass member of claim 1 adapted for use with a socket assembly which has a socket plate with apertures through which said meter jaws extend, and wherein said legs have a generally parallel Z configuration with terminal sections extending between and making electrical contact with said spaced electrically conductive elongated members and having center sections which are secured to said socket plate.

3. A meter socket assembly adapted for use with a neutral bus bar comprising:

a plate member having first and second sides and a plurality of through apertures;

double ended fastenerless meter jaws engaged in and extending through said apertures with one end of each double ended meter jaw projecting from said first and second sides of said plate member;

wherein said plate member has a preset thickness and each of said double ended fastenerless meter jaws has flat elongated members extending through said apertures and confronting tabs bent from said flat elongated members, said confronting tabs being spaced apart not more than about said preset thickness for engaging said first and second sides of said plate member to secure said double ended fastenerless meter jaws in said apertures;

wherein each of said double ended fastenerless meter jaws comprises a pair of confronting compliantly spaced apart flat elongated members and said apertures in said plate member have slots engaging said flat elongated members between said confronting tabs;

wherein said flat elongated members have lateral projections which engage said slots in said apertures in said plate members;

wherein said apertures in said plate member comprise two pairs of apertures with the apertures in each pair laterally spaced and with corresponding apertures in the two pairs aligned; and wherein said plate member has a groove across said second face through which said neutral bus bar is extendable and a neutral jaw on said first face connectable through said plate member to said neutral bus bar.

4. The meter socket assembly of claim 3 wherein said plate member has a transverse groove in said first face in which said neutral jaw is seated.

5. A meter socket assembly adapted for use with a neutral bus bar comprising:

a plate member having first and second sides and a plurality of through apertures;

double ended fastenerless meter jaws engaged in and extending through said apertures with one end of each double ended meter jaw projecting from said first and second sides of said plate member;

wherein said plate member has a preset thickness and each of said double ended fastenerless meter jaws has flat elongated members extending through said apertures and confronting tabs bent from said flat elongated members, said confronting tabs being spaced apart not more than about said preset thickness for engaging said first and second sides of said plate member to secure said double ended fastenerless meter jaws in said apertures;

wherein said apertures in said plate member comprise two pairs of apertures with the apertures in each pair laterally spaced and with corresponding apertures in the two pairs aligned; and wherein said plate member has a groove across said second face through which said neutral bus bar is extendable and a neutral jaw on said first face connectable through said plate member to said neutral bus bar.

6. A meter socket assembly adapted for use with a neutral bus bar comprising:

a plate member having first and second sides and a plurality of through apertures;

double ended fastenerless meter jaws engaged in and extending through said apertures with one end of each double ended meter jaw projecting from said first and second sides of said plate member; and wherein said double ended fastenerless meters jaws comprise a pair of confronting compliantly spaced apart flat elongated members extending through said apertures and including compliant, electrically conductive horn bypass members wedged between and extending laterally outward from between said spaced apart flat elongated members.

7. The meter socket assembly of claim 6 wherein said compliant, electrically conductive horn bypass members comprise U-shaped compliant members having a pair of legs which wedge outward and make electrical contact with said spaced apart flat elongated members.

8. The meter socket assembly of claim 7 wherein said legs have a generally parallel Z configuration with terminal sections extending between and making electrical contact with said spaced apart flat elongated members and center sections which are secured to said socket plate.

9. A meter socket assembly, comprising:

a plate member having first and second sides and a through aperture;

a double ended fastenerless meter jaw engaged in and extending through said aperture with one end of each double ended meter jaw projecting from said first and second sides of said plate member;

wherein said plate member has a preset thickness and said double ended fastenerless meter jaw has a flat elongated member extending through said aperture and confronting tabs extending from said flat elongated member, said confronting tabs being spaced apart not more than about said preset thickness for engaging said first and second sides of said plate member to secure said double ended fastenerless meter jaw in said aperture; and wherein said plate member has a groove across said second face through which said neutral bus bar is extendable and a neutral jaw on said first face connectable through said plate member to said neutral bus bar.

10. A meter socket assembly, comprising:

a plate member having first and second sides and a through aperture;

a double ended fastenerless meter jaw engaged in and extending through said aperture with one end of each double ended meter jaw projecting from said first and second sides of said plate member; and wherein said double ended fastenerless meters jaw comprises a pair of confronting compliantly spaced apart flat elongated members extending through said aperture and including a compliant, electrically conductive horn bypass member wedged between and extending laterally outward from between said spaced apart flat elongated members.

11. A meter socket assembly, comprising:

a plate member having first and second sides and a through apertures;

a double ended fastenerless meter jaw engaged in and extending through said aperture with one end of each double ended meter jaw projecting from said first and second sides of said plate member;

wherein said plate member has a preset thickness and said double ended fastenerless meter jaw has a flat elongated member extending through said aperture and confronting tabs extending from said flat elongated member, said confronting tabs being spaced apart not more than about said preset thickness for engaging said first and second sides of said plate member to secure said double ended fastenerless meter jaw in said aperture;

wherein said aperture in said plate member has a slot extending therefrom; and wherein said flat elongated member has a lateral projection which engages said slot in said aperture in said plate member.

* * * * *